United States Patent
Melecio Ramirez et al.

(10) Patent No.: US 9,618,548 B1
(45) Date of Patent: Apr. 11, 2017

(54) INTEGRATED SYSTEMS FOR MINIATURE CIRCUIT BREAKER LOAD CENTERS

(71) Applicant: SCHNEIDER ELECTRIC USA, INC., Schaumburg, IL (US)

(72) Inventors: Juan Ignacio Melecio Ramirez, Celaya (MX); Vicente Noguez Salazar, El Marques (MX); Pamela Alejandra Calderon Nevarez, Ciudad Cuauhtemoc (MX); Eduardo Salinas Garcia, I, La Paz (MX); Luis Antonio Soto Cossio, Los Mochis-Ahome (MX); Miguel Ivan Hernandez Cuan, Torreon (MX)

(73) Assignee: SCHNEIDER ELECTRIC USA, INC., Andover, MA (US)

( * ) Notice: Subject to any disclaimer, the term of this patent is extended or adjusted under 35 U.S.C. 154(b) by 0 days.

(21) Appl. No.: 14/969,820

(22) Filed: Dec. 15, 2015

(51) Int. Cl.
*G01R 1/20* (2006.01)
*G01R 22/06* (2006.01)
*H02J 13/00* (2006.01)
*G05B 19/048* (2006.01)
*G01R 22/10* (2006.01)

(52) U.S. Cl.
CPC .......... *G01R 22/063* (2013.01); *G01R 22/10* (2013.01); *G05B 19/048* (2013.01); *H02J 13/0017* (2013.01); *G05B 2219/2639* (2013.01)

(58) Field of Classification Search
CPC .......... G01R 1/14; G01R 11/10; G01R 11/21; G01R 23/02; G01R 31/2881; G01R 33/3854; G01R 5/00; G01R 5/14; G01R 9/02; G01R 9/04
See application file for complete search history.

(56) References Cited

U.S. PATENT DOCUMENTS

| | | | |
|---|---|---|---|
| 4,644,320 A * | 2/1987 | Carr ................... | H02J 13/0006 340/12.37 |
| 5,701,110 A | 12/1997 | Scheel et al. | |
| 6,278,605 B1 | 8/2001 | Hill et al. | |
| 6,356,422 B1 | 3/2002 | Bilac et al. | |
| 8,310,370 B1 | 11/2012 | Williams, Jr. et al. | |
| 8,350,417 B1 * | 1/2013 | Dooley ................ | G01R 21/133 307/140 |
| 8,773,827 B2 | 7/2014 | Kiko | |

(Continued)

*Primary Examiner* — Tung X Nguyen
(74) *Attorney, Agent, or Firm* — Locke Lord LLP (57) ABSTRACT

An energy monitoring system for retrofitting a miniature circuit breaker load center 100, comprises energy monitoring module 120, data bus 140, and main controller 110. The energy monitoring module attaches onto miniature circuit breaker 130, forming a combined shape that fits into a branch circuit space of the load center. An attachment connector 320 electrically and mechanically connects the energy monitoring module to load terminal 318 of the circuit breaker. An energy sensing circuit 314 in the energy monitoring module senses energy passing through the circuit breaker and transmits data signals over the data bus to the main controller. The main controller has a shape that fits into another branch circuit space of the load center. The main controller wirelessly transmits to a network, information based on the data signals received on the data bus. The main controller provides operating power via the data bus, to the energy monitoring module.

6 Claims, 7 Drawing Sheets

(56) References Cited

U.S. PATENT DOCUMENTS

| | | |
|---|---|---|
| 2005/0273207 A1 | 12/2005 | Dougherty |
| 2011/0002089 A1 | 1/2011 | Sharp |
| 2014/0164294 A1* | 6/2014 | Osann, Jr. ............. G06Q 50/06 705/412 |
| 2014/0168861 A1 | 6/2014 | Potratz et al. |

* cited by examiner

INTEGRATED SYSTEMS FOR MINIATURE CIRCUIT BREAKER LOAD CENTERS

FIELD OF THE INVENTION

The invention disclosed broadly relates to monitoring electrical energy demand in a load center.

BACKGROUND OF THE INVENTION

In order to better manage energy resources, it will be necessary to monitor and measure energy demand at the individual points of consumption, in homes, at places of business, and at industrial sites. The central point for electrical power distribution in homes, businesses, and factories is the load center, where the branch circuits are organized with branch circuit breakers occupying branch circuit spaces in the load center, and connected through the circuit breakers to an incoming main power bus. The load center is an advantageous location for installing the capability to monitor and measure energy demand.

The universal installation of energy monitoring equipment in homes, businesses, and factories should be simple, practical, and affordable. In the prior art, the installation of intelligent circuit breakers to monitor energy consumption required replacement of existing circuit breakers at a significant expense. The installation of other branch circuit monitoring systems required the installation of current transformers and wiring or multiple, miniature circuit boards in the load center, fastening each current transformer or circuit board to each individual branch circuit line. Such a solution is not necessarily simple, practical, nor inexpensive for a retrofit within the confines of the load center enclosure.

SUMMARY OF THE INVENTION

The invention provides simple, practical, and relatively inexpensive equipment to convert a load center in a home, business, or factory, into an intelligent system to enable management of energy resources.

In a conventional load center for electrical power distribution in a home, business, or factory, branch circuits are organized with branch circuit breakers occupying branch circuit spaces in the load center, and connected through the circuit breakers to an incoming main power bus. The invention enables easy retrofitting of a load center to incorporate monitoring, control, and alert capabilities, without requiring special tools and without the need to replace existing components.

An example embodiment of the invention may be used to retrofit a conventional load center having a plurality of miniature circuit breakers that plug onto the main power bus in the branch circuit spaces. In accordance with the invention, an energy monitoring module may be attached on one end of each circuit breaker in the load center. The combined circuit breaker and energy monitoring module, when attached together, has a form factor small enough to enable it to be plugged onto the main power bus in a branch circuit space. The energy monitoring module includes an attachment connector configured to electrically and mechanically connect to a load terminal of the circuit breaker accessible at the end of the circuit breaker. In accordance with the invention, a main controller having a similar form factor to that of the combined circuit breaker and energy monitoring module, is plugged onto the main power bus in a spare branch circuit space of the load center. A data bus is fastened to the inside, back of the load center to interconnect each of a plurality of energy monitoring modules in the load center, with the main controller.

Each energy monitoring module in the load center, includes an energy sensing circuit that measures the energy corresponding to line voltage and line current conducted through the attached circuit breaker. The energy sensing circuit is configured to transmit data signals characterizing the sensed energy, through the data bus to the main controller in the load center. The main controller includes a power supply configured to provide operating power to each of a plurality of energy monitoring modules in the load center, via the data bus. The main controller includes a microcontroller to manage communications with each of a plurality of energy monitoring modules in the load center, in a master/slave configuration. The microcontroller receives the data signals transmitted from each of a plurality of energy monitoring modules in the load center, collects and formats the data, and presents status and alert signals on an LED display. The main controller includes a radio frequency module configured to wirelessly transmit the data formatted by the microcontroller, to an access point for routing to a network or the Internet, for management of energy resources.

BRIEF DESCRIPTION OF THE DRAWINGS

Example embodiments of the invention are depicted in the accompanying drawings that are briefly described as follows.

DETAILED DESCRIPTION OF THE EXAMPLE EMBODIMENTS

The invention enables easy retrofitting of a load center to incorporate monitoring, control, and alert capabilities, without needing special tools and without the need to replace existing components.

Figure 1:
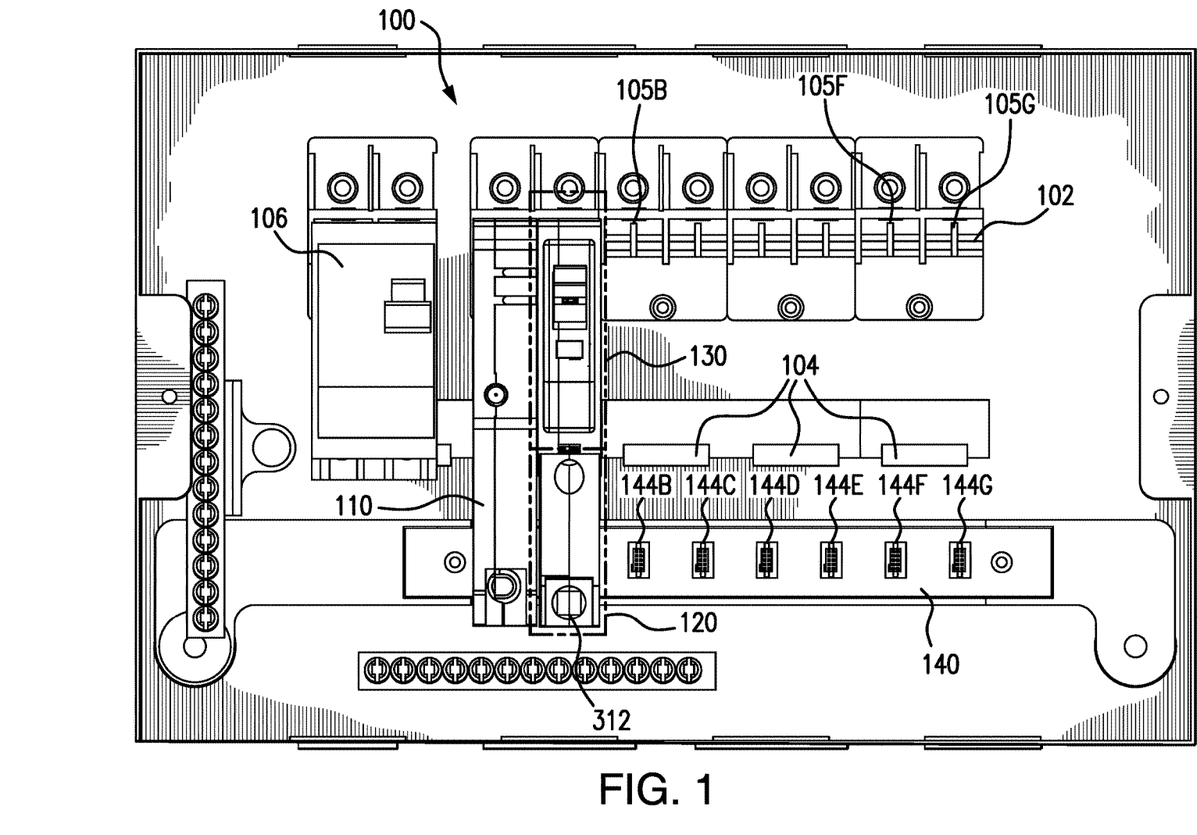
FIG. 1 illustrates an example embodiment of the invention, showing a front view of a load center with a front cover removed. An energy monitoring module is shown retrofitted onto an end of a plug-on miniature circuit breaker that is plugged onto a main power bus in a branch circuit space in the load center. A main controller is shown plugged onto the main power bus in another branch circuit space in the load center. A data bus is shown providing a data signal connection between the energy monitoring module and the main controller in the load center.

FIG. 1 illustrates a front view of a conventional load center 100 with a front cover removed. A main circuit breaker 106 is shown connecting the main power bus 102 to a line power source. The load center 100 accepts a plurality of miniature circuit breakers, such as miniature circuit breaker 130, which plug onto the main power bus 102 in respective branch circuit spaces. The main power bus 102 includes a spaced sequence of position-alignment connectors or stabs 105, 105A-G (shown in FIG. 4A), which respectively align each of a plurality of miniature circuit breakers, such as circuit breaker 130, in respective branch circuit spaces of the load center 100, when the respective circuit breaker is plugged onto a respective one of the position-alignment connectors 105, 105A-G.

In accordance with the invention, an energy monitoring module 120 may be easily attached to each miniature circuit breaker in the load center 100, such as is shown for the circuit breaker 130. The energy monitoring module 120 is shown retrofitted onto an end 300 (FIG. 3B) of the plug-on miniature circuit breaker 130, the circuit breaker being shown having been plugged onto the main power bus 102 in a branch circuit space in the load center 100. The combined circuit breaker 130 and energy monitoring module 120, when attached together, has a form factor small enough to enable it to be plugged onto the main power bus 102 in a branch circuit space. Each circuit breaker in the load center, such as circuit breaker 130, may have an energy monitoring module 120 attached to it. The energy monitoring module 120 has a load terminal 312 (shown in FIG. 3B) for connection to a branch circuit load wire 330 (shown in FIG. 3B). The energy monitoring module 120 measures the energy and power corresponding to line voltage and line current conducted through the attached circuit breaker 130 to the load terminal 312. The energy monitoring module 120 transmits data signals characterizing the measured energy, through a data bus 140 to a main controller 110 in the load center 100.

In accordance with the invention, the main controller 110 is shown plugged onto the main power bus 102 in another branch circuit space in the load center 100. The main controller 110 has a similar form factor to that of the combined circuit breaker 130 and energy monitoring module 120, and may be plugged onto the main power bus 102 in a spare branch circuit space of the load center 100. The main controller 110 receives the data signals from the energy monitoring module 120, via the data bus 140, to determine energy consumption of a branch circuit connected to the circuit breaker 130. The main controller 110 provides operating power to the energy monitoring module 120, via the data bus 140. The main controller 110 wirelessly transmits information based on the received data signals, to an access point for routing to a network or the Internet, for management of energy resources.

In accordance with the invention, the data bus 140 is shown providing a data signal connection between the energy monitoring module 120 and the main controller 110 in the load center. The data bus 140 is configured to conduct data signals from the energy monitoring module 120 to the main controller 110 corresponding to voltage and to line current conducted through the circuit breaker 130. The data bus 140 is also configured to conduct operating power from the main controller 110 to the energy monitoring module 120. The data bus 140 includes a spaced sequence of data connection sockets 142, 144A-G (shown in FIG. 4A), which are respectively aligned with the spaced sequence of position-alignment connectors 105, 105A-G (shown in FIG. 4A), in respective branch circuit spaces of the load center 100. The data bus 140 may be fastened to the inside, back of the load center 100 to interconnect each of a plurality of energy monitoring modules 120 with the main controller 110 in the load center 100. The figure also shows mounting tabs 104, to provide additional support for the main controller 110 (shown in FIG. 2A) and the circuit breaker 130 (shown in FIG. 3B) in the load center 100.

Figure 2A:
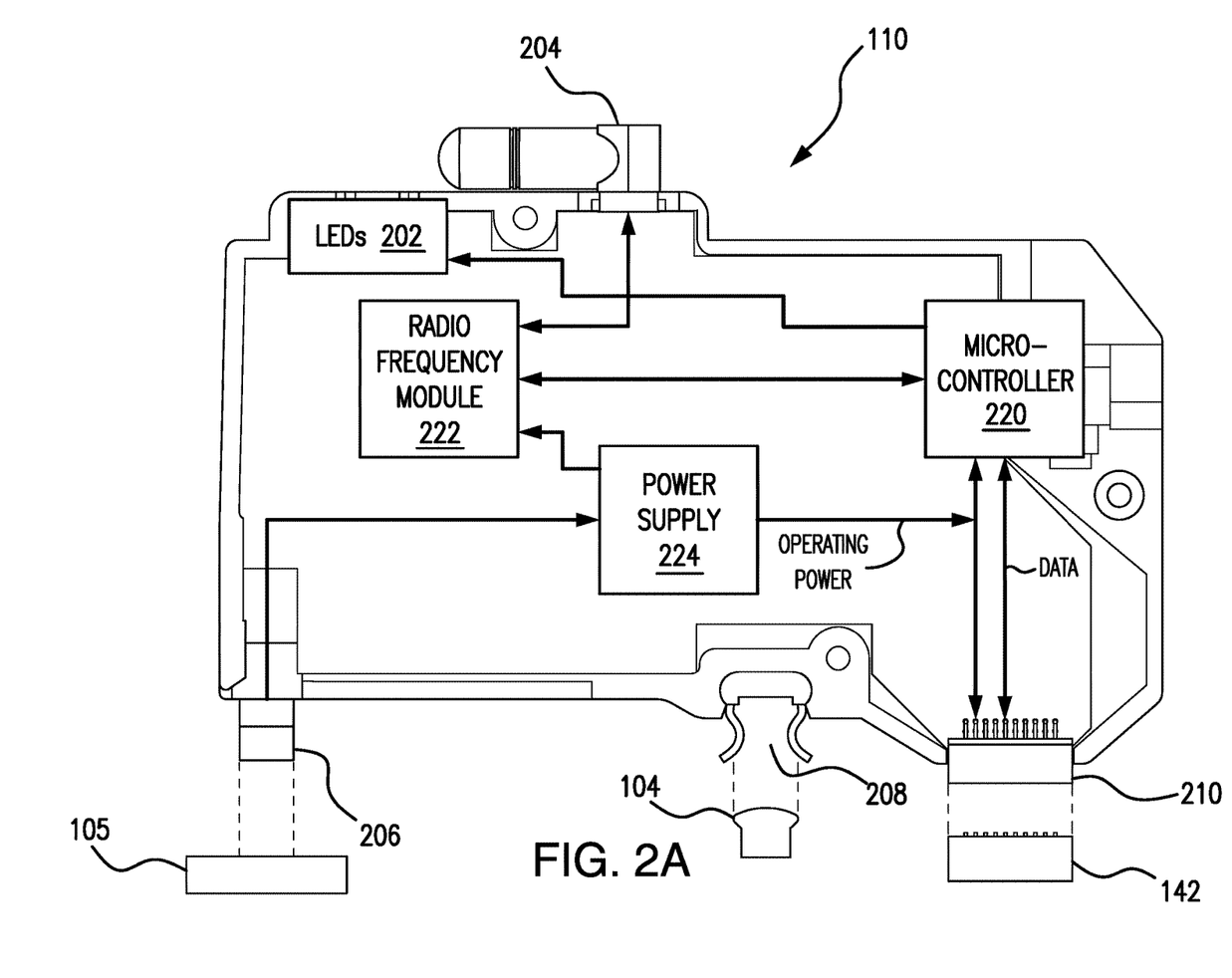
FIG. 2A illustrates an example embodiment of the main controller shown in FIG. 1, showing a side view, in partial cross section, of the interior of the main controller.

FIG. 2A illustrates an example embodiment of the main controller 110 shown in FIG. 1, showing a side view, in partial cross section, of the interior of the main controller 110. The electronics in the main controller 110 include a microcontroller 220, a power supply 224, a radio frequency module 222, an antenna 204, and LEDs 202. A plug-on line connector 206 is shown, configured to plug-on to a position-alignment connector 105 (shown in FIG. 4A) of the main power bus 102, in a branch circuit space in the load center 100, to obtain operating power. A data connector 210 is shown, configured to connect to a data connection socket 142 (shown in FIG. 4A) of the data bus 140. The microcontroller 220 receives data signals from the energy monitoring module 120, via the data bus 140. The microcontroller is configured to analyze the received data signals to determine energy consumption of a branch circuit connected to the energy monitoring module 120. The microcontroller 220 manages communications in a master/slave configuration with a plurality of energy monitoring modules, such as the energy monitoring module 120, in respective branch circuit spaces of the load center 100. The microcontroller 220 receives the data signals transmitted from each of the energy monitoring modules, collects, formats, and analyzes the data, and presents status and alert signals on the LED display 202. The one or more LED lights 202 are configured to indicate information related to the energy consumption of the branch circuit, as determined by the microcontroller 220.

The main controller 110 includes a radio frequency module 222 configured to wirelessly transmit information related to energy consumption, based on the data signals received from the energy monitoring module 120. The information is transmitted to an access point for routing to a network or the Internet, for management of energy resources. The radio frequency module 222 of the main controller 110 may also receive wireless control messages and software updates from the network, for controlling and/or programming the microcontroller 220.

The power supply 224 is connected through the plug-on line connector 206 and the position-alignment connector 105 to the main power bus 102, which typically carries the U. S. Standard line voltage of 120 volts AC at 60 Hertz. The power supply 224 may include a step-down transformer and AC-DC rectifier, to provide a low voltage DC operating power. The low voltage DC operating power is provided to the electronics of the main controller 110, including the microcontroller 220 and radio frequency module 222, and to the energy monitoring module 120, via the data bus 140. Also shown is a plug-on mount 208 that is configured to plug-on to a mounting tab 104 (shown in FIG. 1) in the branch circuit space in the load center 100.

The one or more LED lights 202 connected to the microcontroller 220 are configured to indicate information related to the energy consumption of the branch circuit, as determined by the microcontroller 220.

Figure 2B:
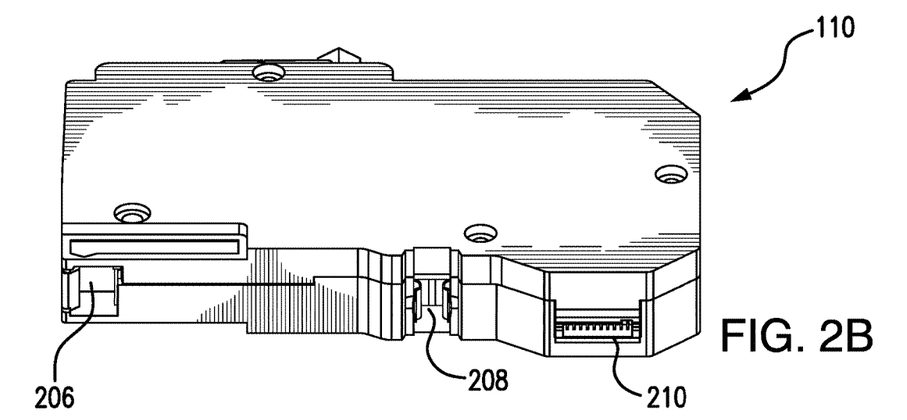
FIG. 2B is back and side perspective view of the main controller shown in FIG. 1, showing a detail of the plug-on line connector, data connector, and plug-on mount.
Figure 2C:
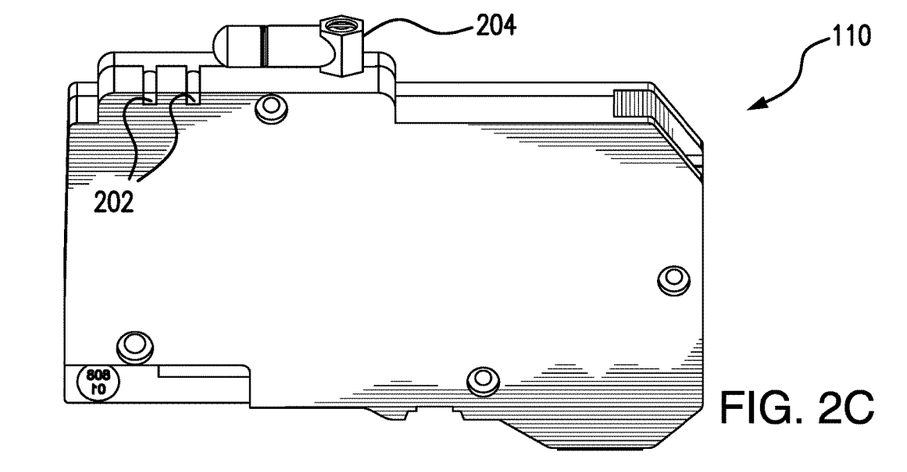
FIG. 2C is a front and side perspective view of the main controller shown in FIG. 1, showing a detail of the antenna and LEDs.

FIG. 2B is back and side perspective view of the main controller 110 shown in FIG. 1, showing a detail of the plug-on line connector 206, data connector 210, and plug-on mount 208. FIG. 2C is a front and side perspective view of the main controller 110 shown in FIG. 1, showing a detail of the antenna 204 and LEDs 202.

Figure 3A:
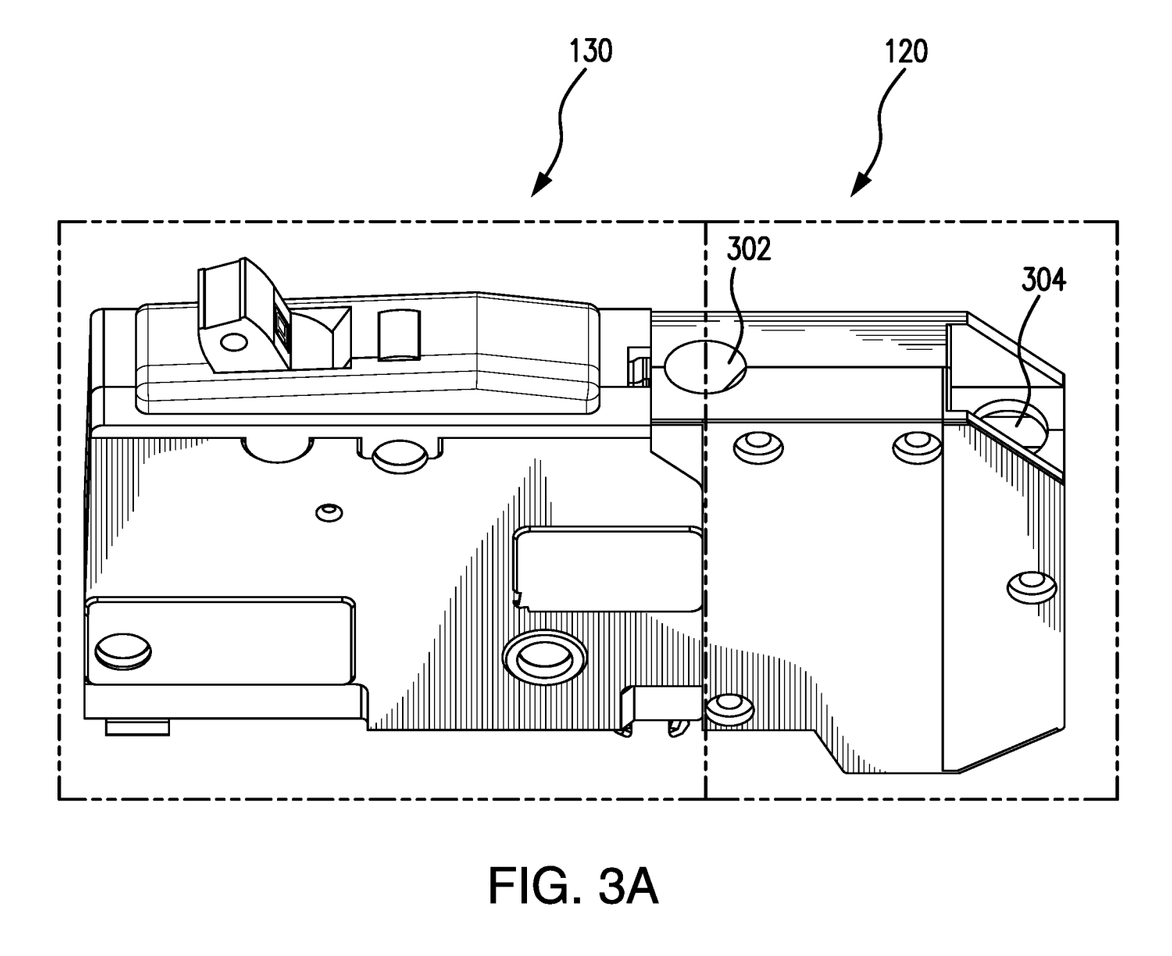
FIG. 3A is a front and side perspective view of an example embodiment of the energy monitoring module retrofitted onto the end of the plug-on miniature circuit breaker, shown in FIG. 1.

FIG. 3A is a front and side perspective view of an example embodiment of the energy monitoring module 120 shown retrofitted onto the end 300 (shown in FIG. 3B) of the plug-on miniature circuit breaker 130 shown in FIG. 1. FIG. 3A shows an access hole 302 through the front of the energy monitoring module 120, for entry of a screw driver to tighten a screw fastening the attachment connector 320 (shown in FIG. 3B) to the load terminal 318 (shown in FIG. 3B) of the circuit breaker 130. In this manner, the energy monitoring module 120 may be easily attached to the miniature circuit breaker 130 without requiring special tools and without the need to replace the existing circuit breaker 130. FIG. 3A shows another access hole 304 through the front of the energy monitoring module 120 for entry of a screw driver to tighten a screw clamping the branch circuit load wire 330 (shown in FIG. 3B) to the load terminal 312 (shown in FIG. 3B) of the energy monitoring module 120. In this manner, the load wire 330 may be connected to the energy monitoring module 120 in the same manner as it would have been previously connected directly to the load terminal of the circuit breaker 130.

Figure 3B:
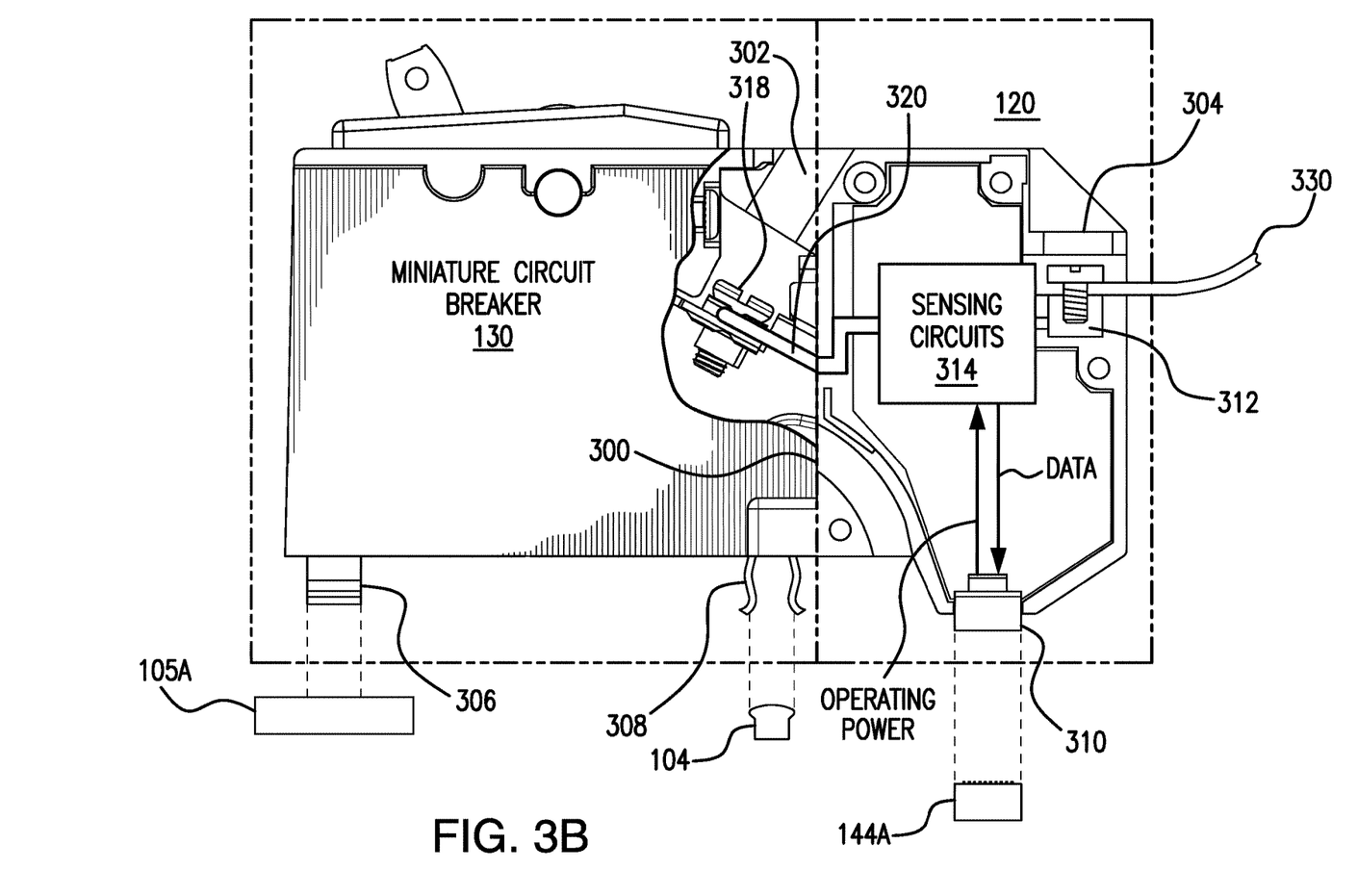
FIG. 3B shows a side view, in partial cross section, of the interior of the energy monitoring module retrofitted onto the end of the plug-on miniature circuit breaker. The figure shows a detail of the attachment connector configured to electrically and mechanically connect to a load terminal of the circuit breaker, which is accessible at the end of the circuit breaker.

FIG. 3B shows a side view, in partial cross section, of the interior of the energy monitoring module 120 shown retrofitted onto the end 300 of the plug-on miniature circuit breaker 130. The plug-on miniature circuit breaker 130 may be a standard design with a plug-on line connector 306 configured to plug-on to a position-alignment connector 105A (shown in FIG. 4A) of the main power bus 102 in the load center 100. As previously mentioned, the main power bus 102 typically carries the U. S. Standard line voltage of 120 volts AC at 60 Hertz. The circuit breaker 130 may include a thermal-magnetic mechanism to detect an overcurrent condition, and to operate a trip opening mechanism, to interrupt current flow from the line connector 306 to the load terminal 318, and thus to any connected branch circuit.

The figure shows a detail of the attachment connector 320 configured to electrically and mechanically connect to the load terminal 318 of the circuit breaker 130, which is accessible at the end 300 of the circuit breaker 130. The attachment connector 320 may be a copper conductor, or any other alloy that is a good conductor of electrical current, which is part of the current path of the load terminal 318 of the circuit breaker 130. The load terminal 312 of the energy monitoring module 120, which is electrically connected to the attachment connector 320, is shown connected to the load wire 330 of a branch circuit load. FIG. 3B shows the energy monitoring module 120 including an energy sensing circuit 314 configured to sense energy conducted from the load terminal 318 of the circuit breaker 130 through the attachment connector 320 to the load terminal 312 of the energy monitoring module 120. The energy sensed by the energy sensing circuit 314 corresponds to the voltage and line current conducted from the plug-on line connector 306, through the circuit breaker 130, to the load terminal 318 of the circuit breaker 130.

The energy sensing circuit 314 may include a current transformer, Rogowski coil, or Hall-effect device that detects the current flowing through the attachment connector 320 and generates an analog signal corresponding to the magnitude of the sensed current. The attachment connector 320 may be directly connected between the load terminal 318 of the circuit breaker 130 and the load terminal 312 of the energy monitoring module 120. When a current transformer or Rogowski coil is employed as the current sensing device in the energy sensing circuit 314, the attachment connector 320, serving as the primary, may pass through the central opening of the annularly-shaped current sensor or Rogowski coil, serving as the secondary. Alternately, when a Hall-effect device is employed as the current sensing device in the energy sensing circuit 314, the Hall-effect device may be positioned adjacent to the attachment connector 320 to detect the magnetic field surrounding the attachment connector 320. The energy sensing circuit 314 may include an analog to digital converter to convert the analog sensed signal to a digital measurement of the magnitude of the sensed current. The energy sensing circuit 314 may include a digital potentiometer with a connection to the load line, to measure the voltage of the attachment connector 320 with respect to a reference potential, such as ground potential, and provide a digital measurement of the voltage. The energy sensing circuit 314 may include signal conditioning circuits for the voltage and current measurements.

The energy sensing circuit 314 may include a microprocessor to analyze the digital measurements of the current and the digital measurements of the voltage. The energy sensing circuit 314 may provide data for active, reactive, and apparent energy measurements, line-voltage, period measurement, digital representations of the voltage and current waveforms, and RMS calculations on the voltage and current. The energy sensing circuit 314 sends all the provided data as data signals through a data connector 310 and data connection socket 144A, which connect to the data bus 140. The data bus 140 may be, for example, a Serial Peripheral Interface (SPI) protocol data bus, but various other bus protocols are available. The energy sensing circuit 314 may optionally generate a combined signal that includes information identifying the circuit breaker 130 and a value characterizing the energy sensed by the energy sensing circuit 314. The respective data connection socket 144A-144G of the data bus 140 (shown in FIGS. 4A and 4C), is configured to pass the data signal transmitted from the energy sensing circuit 314 to the data bus 140. The energy sensing circuit 314 receives low voltage DC operational power from the main controller 110 via the data bus 140.

Also shown in FIG. 3B is a plug-on mount 308 that is configured to plug-on to a mounting tab 104 (shown in FIG. 1) in the branch circuit space in the load center 100.

Figure 3C:
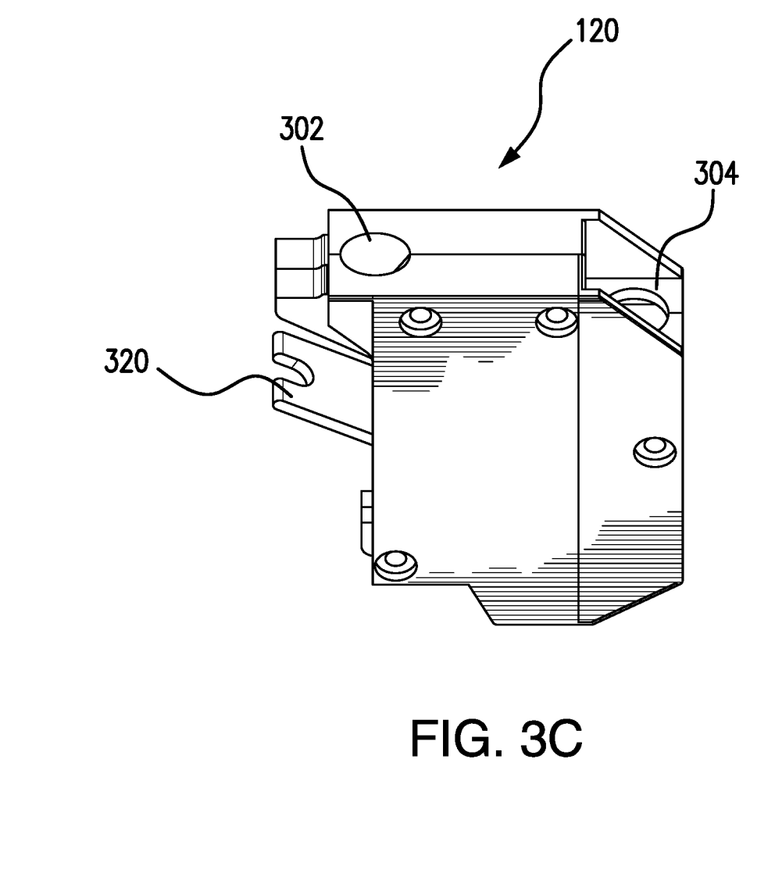
FIG. 3C is a front and side perspective view of the energy monitoring module shown in FIG. 1, showing a detail of the attachment connector.
Figure 3D:
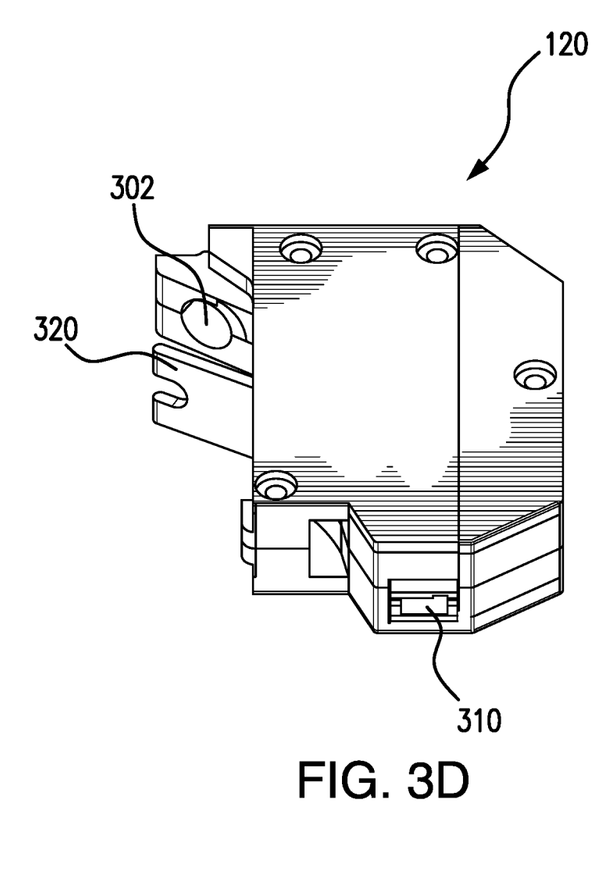
FIG. 3D is back and side perspective view of the energy monitoring module shown in FIG. 1, showing a detail of the data connector.

FIG. 3C is a front and side perspective view of the energy monitoring module 120 shown in FIG. 1, showing a detail of the attachment connector 320. FIG. 3C shows a detailed view of the access hole 302 providing access to fasten the attachment connector 320 to the load terminal 318 of the circuit breaker 130. FIG. 3C also shows a detailed view of the access hole 304 providing access for clamping the load wire 330 to the load terminal 312 of the energy monitoring module 120. FIG. 3D is back and side perspective view of the energy monitoring module 120 shown in FIG. 1, showing a detail of the data connector 310 and the access hole 302.

Figure 4A:
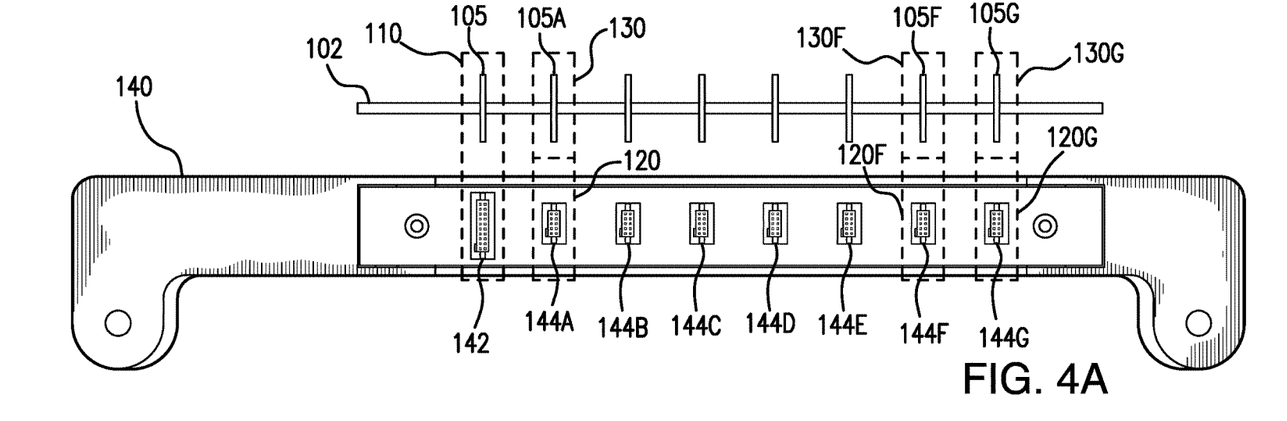
FIG. 4A is a front view of the data bus and the main power bus, showing the position-alignment connectors of the main power bus, which are aligned with the data connection sockets of the data bus, each position-alignment connector and corresponding data connection socket residing in a respective branch circuit space in the load center.
Figure 4B:
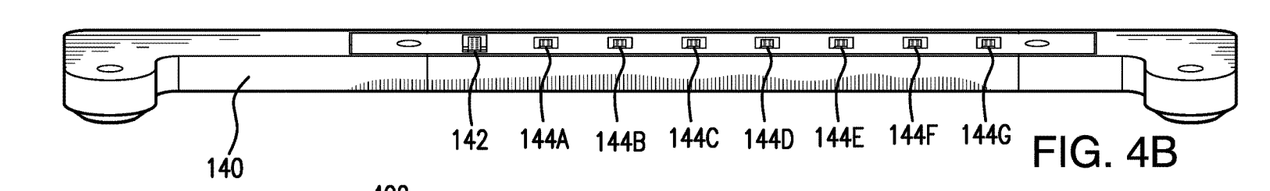
FIG. 4B is a front and side perspective view of the data bus of FIG. 4A.

FIG. 4A is a front view of the data bus 140 and the main power bus 102, showing the position-alignment connectors 105 and 105A-105G of the main power bus 102, which are aligned with corresponding data connection sockets 142 and 144A-144G of the data bus 140. Each of the position-alignment connectors 105 and 105A-105G and corresponding data connection sockets 142 and 144A-144G resides in a respective branch circuit space in the load center 100. An example plurality of three example circuit breakers 130, 130F, and 130G and their attached respective energy monitoring modules 120, 120F and 120G are shown in phantom lines. When a plug-on line connector 306 of a circuit breaker 130, for example, is plugged onto a position-alignment connector 105A-105G of the main power bus 102, the energy monitoring module 120 attached to the circuit breaker 130, has its data connector 310 juxtaposed for connection with a corresponding data connection socket 144A-144G of the data bus 140. FIG. 4B is a front and side perspective view of the data bus of FIG. 4A, showing the data connection sockets 142 and 144A-144G.

Figure 4C:
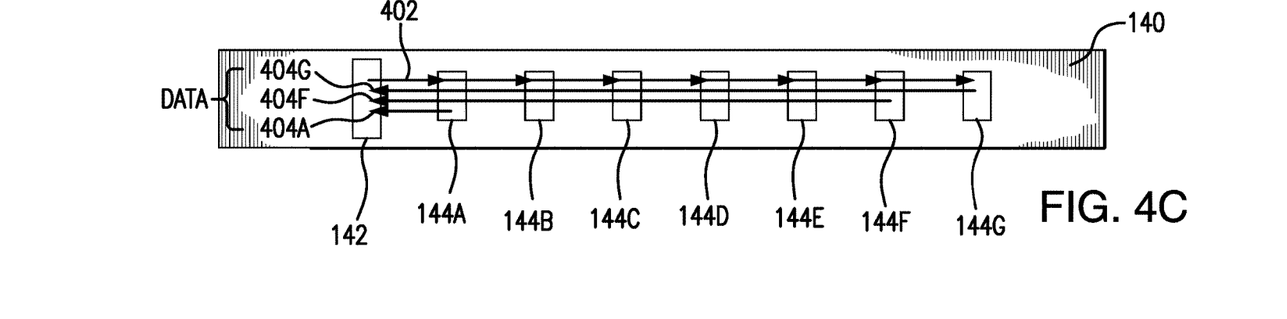
FIG. 4C is a front, schematic depiction of the operational power conductor and the data signal pathways in the data bus.

FIG. 4C is a front, schematic depiction of the operational power conductor 402 for the main controller 110 to provide low voltage DC operational power to each of the energy monitoring modules 120, 120F and 120G shown in the figure. The data signal pathways 404A, 404F, and 404G in the data bus 140, run between the main controller 110 and the respective energy monitoring modules 120, 120F and 120G. The data signal pathways 404A, 404F, and 404G may be individual conductors or they may be multiplexed signals conveyed via a data bus (such as SPI, $I^2C$, UNI/O, etc.), an optical fiber, or a wireless bus, such as Bluetooth™.

Although specific example embodiments of the invention have been disclosed, persons of skill in the art will appreciate that changes may be made to the details described for the specific example embodiments, without departing from the spirit and the scope of the invention.

The invention claimed is:

1. An energy monitoring system for retrofitting a miniature circuit breaker load center, comprising:
    an energy monitoring module configured to attach onto an end of a plug-on miniature circuit breaker;
    the circuit breaker and energy monitoring module, when attached together, having a shape capable of fitting into a branch circuit space of the load center;
    the energy monitoring module including an attachment connector configured to electrically and mechanically connect to a load terminal of the circuit breaker accessible at the end of the circuit breaker;
    the energy monitoring module including its own load terminal electrically connected to the attachment connector and configured to connect to a branch circuit load wire;
    the circuit breaker including a plug-on line connector configured to plug-on to a position-alignment connector of a main power bus in the load center;
    the energy monitoring module including an energy sensing circuit configured to sense energy conducted from the load terminal of the circuit breaker through the attachment connector to the load terminal of the energy monitoring module, the energy sensing circuit being configured to transmit a data signal characterizing the energy sensed by the energy sensing circuit, the energy monitoring module including a data connector having a data signal connection to the energy sensing circuit;
    a data bus in the load center, the data bus including a data connection socket being configured to connect to the data connector of the energy monitoring module, the data connector and data connection socket being configured to pass the data signal transmitted from the energy sensing circuit to the data bus; and
    a main controller having a plug-on line connector configured to plug-on to another position-alignment connector of the main power bus in the load center, the main controller having a shape capable of fitting into a branch circuit space of the load center, the main controller including a data connector configured to connect to another data connection socket of the data bus in the load center, the main controller including electronics configured to obtain operating power from the plug-on line connector of the main controller, the electronics having a data signal connection to the data connector of the main controller, the electronics being configured to receive from the data bus, via the data connector of the main controller and the another data socket, the data signal from the energy sensing circuit of the energy monitoring module, the electronics being configured to monitor the data signal received from the energy monitoring module, the electronics being configured to wirelessly transmit information related to energy consumption, based on the data signal received from the energy sensing circuit of the energy monitoring module, the main controller being further configured to provide operating power via the data bus, to the energy monitoring module.

2. The energy monitoring system for retrofitting a miniature circuit breaker load center of claim 1, wherein the electronics of the main controller further includes a microcontroller configured to receive the data signal transmitted from the energy sensing circuit of the energy monitoring module, the microcontroller being configured to analyze the received data signal to determine energy consumption.

3. The energy monitoring system for retrofitting a miniature circuit breaker load center of claim 2, wherein the electronics of the main controller further includes a radio frequency module connected to the microcontroller and an antenna connected to the radio frequency module, the radio frequency module and the antenna being configured to wirelessly transmit information related to the energy consumption, as determined by the microcontroller.

4. The energy monitoring system for retrofitting a miniature circuit breaker load center of claim 3, wherein the electronics of the main controller further includes a power supply circuit configured to obtain operating power from the plug-on line connector, to provide operating power to the microcontroller and radio frequency module and to provide operating power via the data bus, to the energy monitoring module.

5. The energy monitoring system for retrofitting a miniature circuit breaker load center of claim 2, wherein the electronics of the main controller further includes one or more LED lights connected to the microcontroller the one or more LED lights being configured to indicate information related to the energy consumption, as determined by the microcontroller.

6. The energy monitoring system for retrofitting a miniature circuit breaker load center of claim 1, wherein the data bus includes a first data connection socket configured to connect to the data connector of the main controller and a plurality of data connection sockets, each data connection socket being configured to connect to a respective one of a plurality of energy monitoring modules in the load center.

* * * * *